(12) United States Patent
Lin et al.

(10) Patent No.: US 7,917,244 B2
(45) Date of Patent: Mar. 29, 2011

(54) METHOD AND SYSTEM FOR REDUCING CRITICAL DIMENSION SIDE-TO-SIDE TILTING ERROR

(75) Inventors: Cheng-Ming Lin, Yunlin County (TW); Chai-Wei Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 395 days.

(21) Appl. No.: 11/686,238

(22) Filed: Mar. 14, 2007

(65) Prior Publication Data
US 2008/0228309 A1 Sep. 18, 2008

(51) Int. Cl.
G06F 19/00 (2006.01)
G03C 5/00 (2006.01)
(52) U.S. Cl. .......................................... 700/121; 430/30
(58) Field of Classification Search .......... 700/108–110, 700/121; 250/492.1, 492.2; 355/52, 53, 355/55; 430/30
See application file for complete search history.

(56) References Cited

U.S. PATENT DOCUMENTS

| | | | |
|---|---|---|---|
| 5,585,629 A * | 12/1996 | Doran et al. | 250/310 |
| 5,858,590 A * | 1/1999 | Kwon et al. | 430/30 |
| 6,331,711 B1 * | 12/2001 | Vernon | 250/492.2 |
| 6,344,750 B1 * | 2/2002 | Lo et al. | 250/492.2 |
| 6,398,374 B1 * | 6/2002 | Chapman et al. | 359/857 |
| 6,509,952 B1 * | 1/2003 | Govil et al. | 355/52 |
| 6,566,897 B2 * | 5/2003 | Lo et al. | 250/492.2 |
| 6,625,512 B1 * | 9/2003 | Goodwin | 700/121 |
| 6,704,093 B2 * | 3/2004 | Kurosawa | 355/53 |
| 6,744,494 B2 * | 6/2004 | Maltabes et al. | 355/53 |
| 6,753,947 B2 * | 6/2004 | Meisburger et al. | 250/492.2 |
| 6,794,302 B1 * | 9/2004 | Chen et al. | 438/714 |
| 6,897,157 B2 * | 5/2005 | Liang et al. | 430/5 |
| 7,150,949 B2 * | 12/2006 | Askebjer et al. | 430/30 |
| 7,247,412 B2 * | 7/2007 | Lee | 430/30 |
| 7,325,224 B2 * | 1/2008 | Seltmann et al. | 716/21 |
| 7,443,486 B2 * | 10/2008 | Van Ingen Schenau et al. | 430/30 |
| 2003/0107720 A1 * | 6/2003 | Maltabes et al. | 355/77 |
| 2005/0075835 A1 | 4/2005 | Tseng et al. | |
| 2005/0120328 A1 * | 6/2005 | Seltmann et al. | 716/21 |
| 2007/0065729 A1 * | 3/2007 | Zait et al. | 430/30 |
| 2007/0141486 A1 * | 6/2007 | Verstappen et al. | 430/30 |
| 2007/0186207 A1 * | 8/2007 | Sandstrom | 716/21 |
| 2007/0293973 A1 * | 12/2007 | Kiers et al. | 700/121 |
| 2008/0087077 A1 * | 4/2008 | Mininni | 73/105 |

OTHER PUBLICATIONS

Tichy, Peter, et al., "First Photomask Developer Based on State of the Art Wafer Processing Technology," Tokyo Electron Limited, TBS Broadcast Center 3-6 Akasaka 5-chome, Minato-ku, Tokyo 107-8481, Japan, Advanced Mask Technology Center, Rahnitzer Allee 9, D-01109 Dresden, Germany, 11 pages, 2004.

* cited by examiner

Primary Examiner — Charles R Kasenge
(74) Attorney, Agent, or Firm — Haynes and Boone, LLP

(57) ABSTRACT

A method for reducing a critical dimension error of a substrate is provided. A first function is identified for correlating a critical dimension error with a first effect. A second function is identified for correlating a critical dimension error with a scan speed. An optimal scan speed for minimizing the critical dimension error is identified by substantially equating the first function and the second function. The substrate may be a mask or a wafer.

19 Claims, 5 Drawing Sheets

| Scan | 100 | 130 | 137 | 145 | 180 |
|---|---|---|---|---|---|
| ADI CDU | 7.1 | 5.8 | 4.7 | 5.1 | 8.3 |
| Side-side | -4.5 | -2.1 | 0.8 | 2.5 | 4.5 |

Fig. 4

METHOD AND SYSTEM FOR REDUCING CRITICAL DIMENSION SIDE-TO-SIDE TILTING ERROR

BACKGROUND

In semiconductor manufacturing technology, a mask (also referred to as a photomask or reticle) is used by a photolithography system to expose a pattern onto a substrate. The pattern can include many small or tight features, which are defined by a critical dimension (CD). However, as critical dimensions become smaller, for example from 45 nm to 32 nm, the time required to expose the pattern on the substrate becomes longer. For example, it is not unusual to require 5 to 10 hours to expose a mask pattern on a substrate.

As exposure times become longer, certain problems can arise. One such problem is referred to as a blank photoresist vacuum effect. The blank photoresist vacuum effect refers to variations in the sensitivity of the photo-sensitive material (e.g., the resist) used on the substrate that occur during long exposure times. These variations in sensitivity can cause shifting of critical dimensions between local areas of the substrate. The shifting of critical dimensions between local areas is referred to as a CD side-to-side tilting error. The CD side-to-side tilting error in turn affects the CD uniformity of the underlying substrate.

A need exists for a method and system that reduces the CD side-to-side tilting error, which will in turn improve the CD uniformity of the patterned substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4 is a table comprising exemplary data of the CD side-to-side model in accordance with an aspect of the present disclosure.

DETAILED DESCRIPTION

Figure 1:
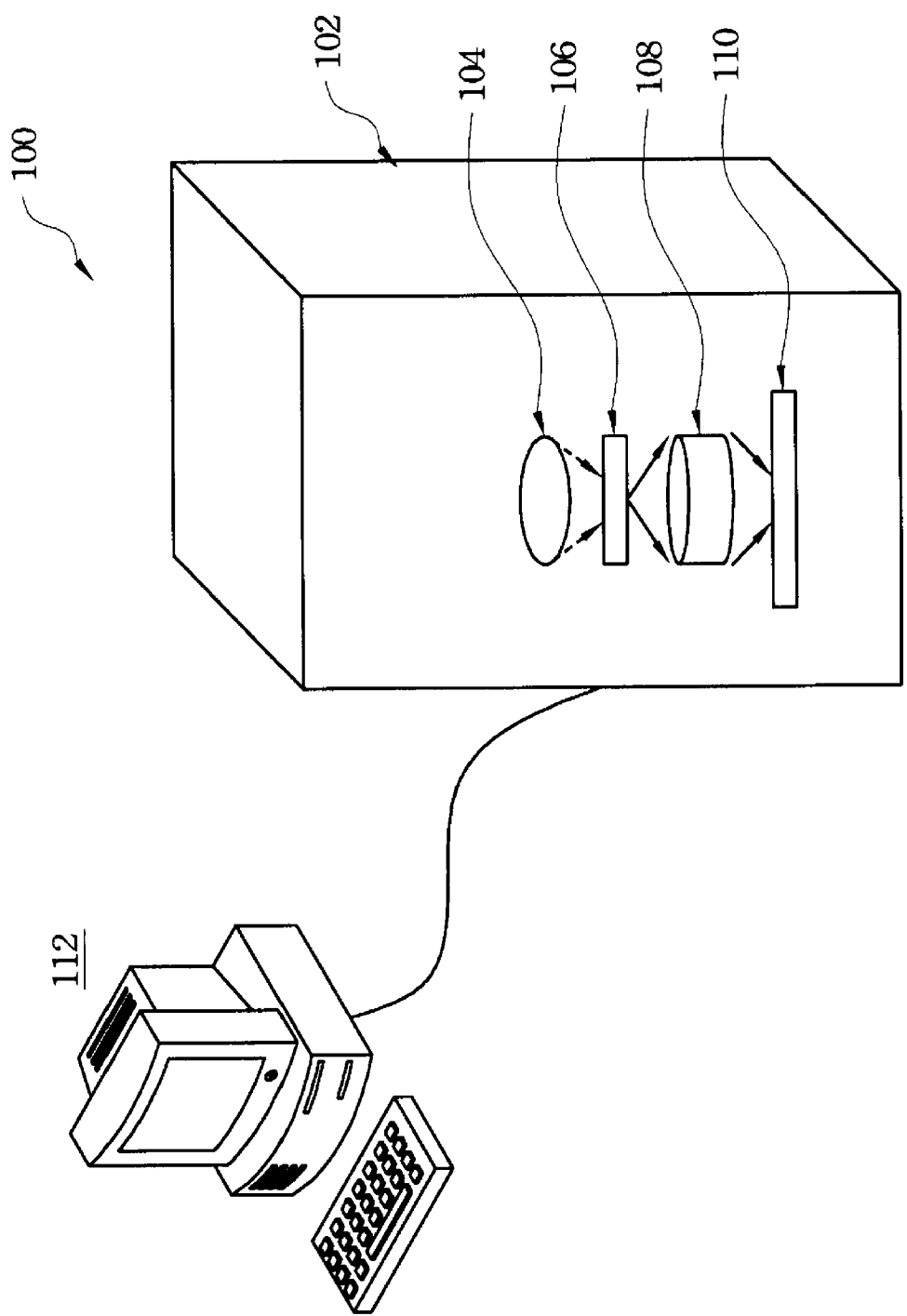
FIG. 1 is a system for exposing a mask or a wafer in accordance with an aspect of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, a system 100 for exposing a pattern with reduced side-to-side tilting error is illustrated in accordance with one embodiment of the present disclosure. The system includes an exposure system 102. In the present embodiment, the exposure system 102 includes a radiation source 104, a mask or reticle 106, projection lens(es) 108, and a substrate 110 such as a photolithography mask or a semiconductor wafer. The exposure system 102 is a scanning exposure system. It is understood that there are many different types of exposure systems that can benefit from the present invention, including immersion lithography systems, scan-step systems, and e-beam systems, and that the presently disclosed system is provided for example.

In the present embodiment, the substrate 110 has been coated with a radiation-sensitive material, such as photoresist. The coating can be performed by various processes, including spin-on coating. After exposure, a post-exposure bake can be applied to the substrate 110. Resist coating and baking are well known procedures, and will therefore not be described in further detail.

The system 100 also includes an operator data processing system 112 for controlling aspects of the exposure system 102, as further discussed below. The operator data processing system 112 can be in the form of an integrated or detached computer, and can be a system that performs multiple functions in additions to the ones described below. The operator data processing system 112 includes a memory and one or more processors for storing and executing instructions. The operator data processing system 112 also includes input and output elements for communicating with, controlling and/or sharing data with the exposure system 102. During an exposure process, data from the exposure system 102, including exposure time and CD shifts between local areas of the processing mask or wafer, may be collected by the data processing system 112.

Depending on various factors, such as the complexity of the pattern, the size of the substrate, and/or the CD, exposure of a mask or wafer may take a long time, for example from 1 to 10 hours. As discussed above, long exposure times can result in variations or shifting of the critical dimensions of certain pattern features in different local areas of the substrate, referred to as CD side-to-side tilting error.

Figure 2:
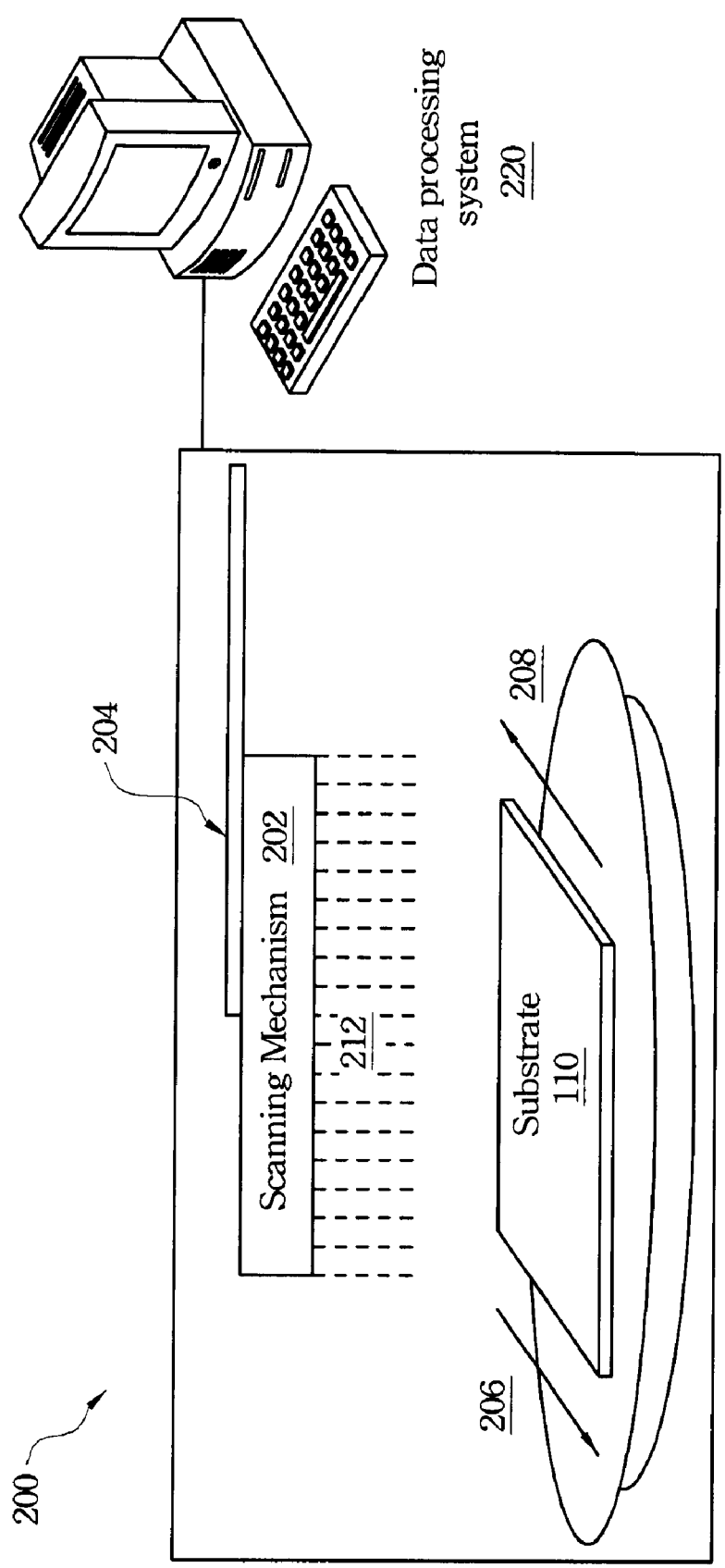
FIG. 2 is a scanning system for developing the mask or wafer after exposure and post-exposure bake in accordance with an aspect of the present disclosure.

Referring to FIG. 2, after exposure and post-exposure bake, the substrate 110 is provided to a developing system 200. The developing system 200 is configured and operable to compensate for any CD side-to-side tilting errors by dynamically optimizes a scan speed of the system 200. According to one embodiment, the developing system 200 comprises a scanning mechanism 202 and a puddle arm 204. The scanning mechanism 202 is controlled by the puddle arm 204, which moves the scanning mechanism 202 in forward 206 or backward 208 directions when scanning the substrate 110. The scan speed of the scanning mechanism 202 varies based on the type of scanning performed. For example, the scan speed may be faster in a forward scan 206 than in a backward scan 208. As the substrate 110 is scanned by the scanning mechanism 202, the puddle arm 204 provides liquid chemicals 212 to the scanning mechanism 202, which disburses the chemicals 212 across the entire substrate 110 to develop the pattern on the substrate.

The developing system 200 is coupled to a data processing system 220, which controls the scan speed of the scanning mechanism 202. The data processing system 220 can be in the form of an integrated or detached computer, and can be a system that performs multiple functions in additions to the ones described below. The data processing system 220 includes a memory and one or more processors for storing and executing instructions. In some embodiments, the data processing system 220 can be the same as the operator data processing system 112 (FIG. 1) used during exposure. In other embodiments, a plurality of systems can be used to perform the functions described herein for either or both systems 112, 220.

During developing, the data processing system 220 collects data from the developing system 200, including the scan speed of the scanning mechanism 202 and CD shifts between local areas of the substrate 110. Aspects of the present disclosure may be implemented as software executing within a data processing system 220. In one embodiment, a vacuum effect model is provided to correlate between CD side-to-side tilting error and exposure time. In addition, a CD side-to-side model is provided. The CD side-to-side model correlates between CD side-to-side tilting error of the substrate 110 and scan speed of the scanning mechanism 202. Based on the vacuum effect model and CD side-to-side model, the scan speed may be dynamically adjusted in the developing system 200 to compensate for the CD side-to-side tilting error caused by the vacuum effect.

Figure 3:
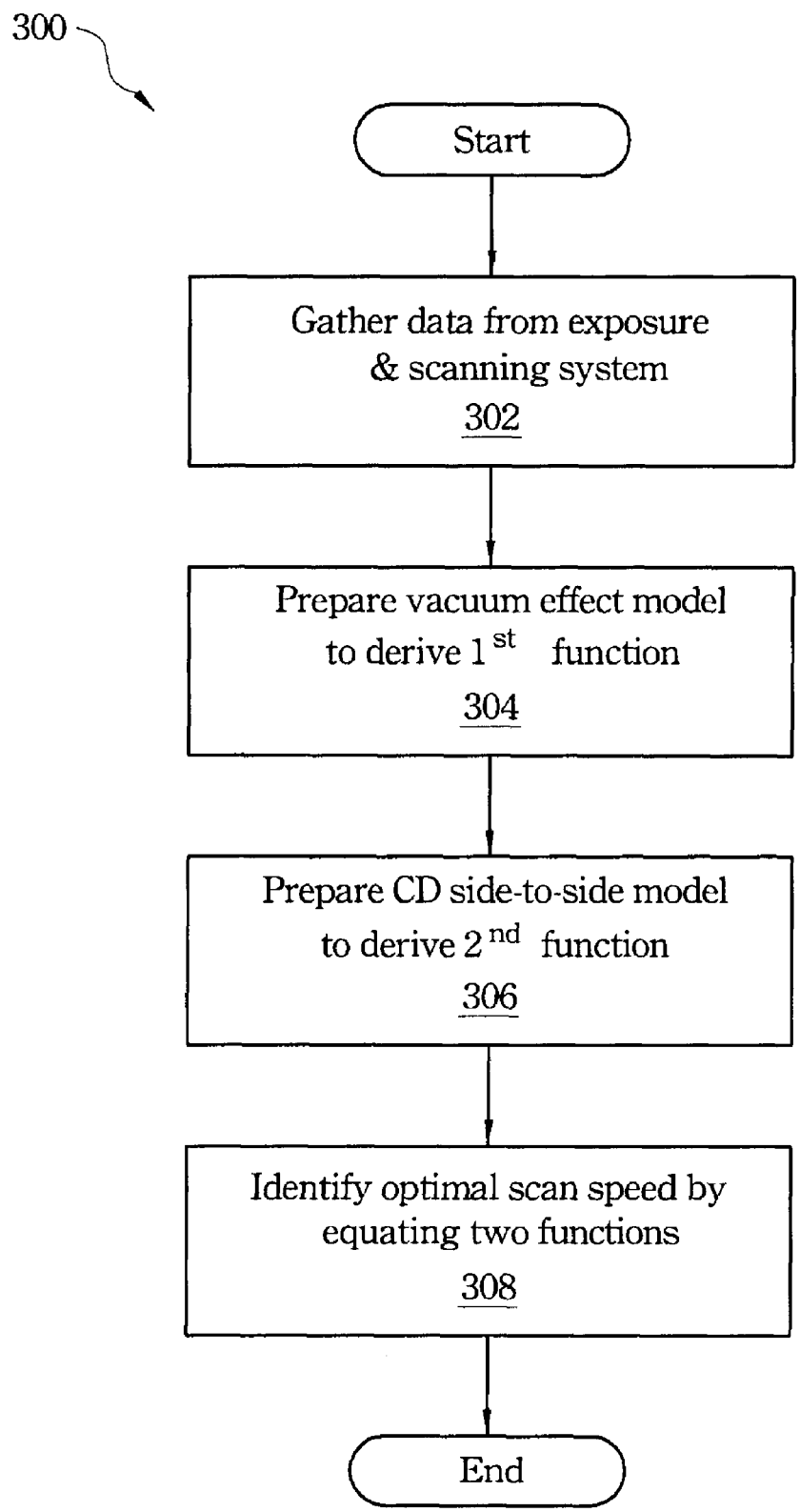
FIG. 3 is a flowchart of an exemplary process for reducing CD side-to-side tilting error.

Referring to FIG. 3, an exemplary process 300 for reducing CD side-to-side tilting error begins at step 302. Data is gathered, including exposure time from the photolithography equipment 100 and scan speed from the developing system 200, and provided to the data processing system 220. Process 300 then continues to step 304 to prepare a vacuum effect model. Since the CD side-to-side tilting error can be caused by the photoresist vacuum effect resulting from long exposure time, a first function is derived from the vacuum effect model that expresses the CD side-to-side tilting error in terms of exposure time.

Process 300 then continues to step 306 to prepare a CD side-to-side model. From this model, a second function is derived that expresses the CD side-to-side tilting error in terms of scan speed of the scanning mechanism 202. The process then continues to step 308 to identify optimal scan speed by equating the two equations. For example, the scan speed is adjusted such that the first function and the second function are equal. It is noted that process 300 may be implemented within a data processing system, such as data processing system 112 in FIG. 1 or data processing system 220 in FIG. 2.

An example of the first function derived for a local area in the vacuum effect model is illustrated in equation (1).

$$y1 = a1*x1 + a0 \quad (1)$$

Equation (1) is a linear function that expresses the CD side-to-side tilting error in terms of exposure time of a local area on a mask or wafer in the exposure system 102. In this example, y1 represents the CD side-to-side tilting error. The value x1 represents the exposure time. The values a0 and a1 are constants. Equation (1) is a function that illustrates the blank material photoresist vacuum effect caused by long exposure time. In one embodiment, constants a0 and a1 may be derived based on different CD side-to-side tilting errors and exposure times collected from different masks or wafers. Constants a0 and a1 may vary based on the type of the photoresist or writer used.

An example of the second function derived for a local area in the CD side-to-side model is illustrated in equation (2).

$$y2 = b1*x2 + b0 \quad (2)$$

Equation (2) is a linear function that expresses the CD side-to-side tilting error in terms of scan speed of the scanning mechanism 202. In this example, y1 represents the CD side-to-side tilting error of a local area in a mask or wafer in developing system 200. The value x2 represents the scan speed of the scanning mechanism 202. The values b0 and b1 are constants. Equation (2) is a function that illustrates the mask CD side-to-side tilting error in relation to the backward scan speed of the scanning mechanism 102. In one embodiment, constants b0 and b1 may be derived based on different CD side-to-side tilting errors and scan speeds collected from different masks or wafers. Constants b0 and b1 may vary based on the type of the photoresist or writer used.

An example of equating the first and second functions is illustrated in equation (3).

$$y1 = y2 \quad (3)$$

In order to minimize the CD side-to-side tilting error to near zero, CD side-to-side tilting errors y1 and y2 are set to be equal, as illustrated in equation (4).

$$a1*x1 + a0 = b1*x2 + b0 \quad (4)$$

The scan speed, x2, may be adjusted such that the equation (1) and equation (2) are equal, as illustrated in equation (4). The adjusted scan speed x2 is an optimal scan speed that reduces the CD side-to-side tilting error to near zero. With a near zero error, the CD uniformity of the mask or wafer may be improved.

Figure 4:
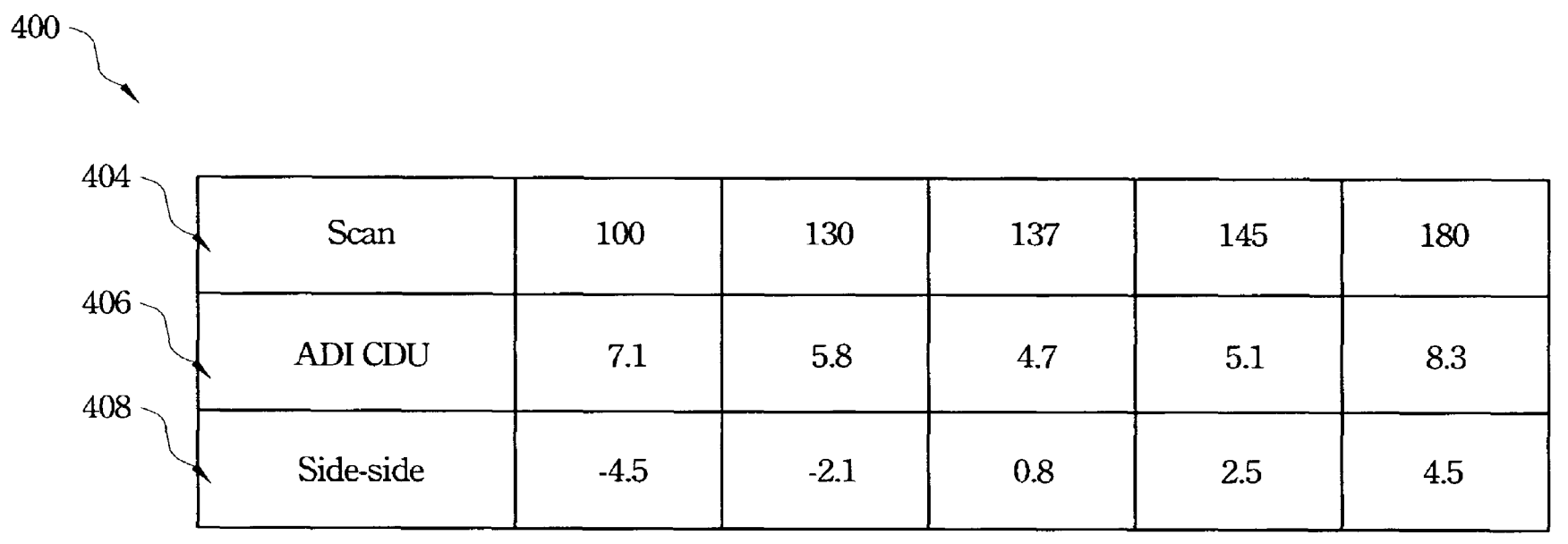

Referring to FIG. 4, a graph of the CD side-to-side model and exemplary data are illustrated in accordance with an aspect of the present disclosure. Table 400 comprises data gathered from the developing system 200. In this example, table 400 includes data for backward scan speed 404, critical dimension measured 406, and CD side-to-side tilting error 408.

Figure 5:
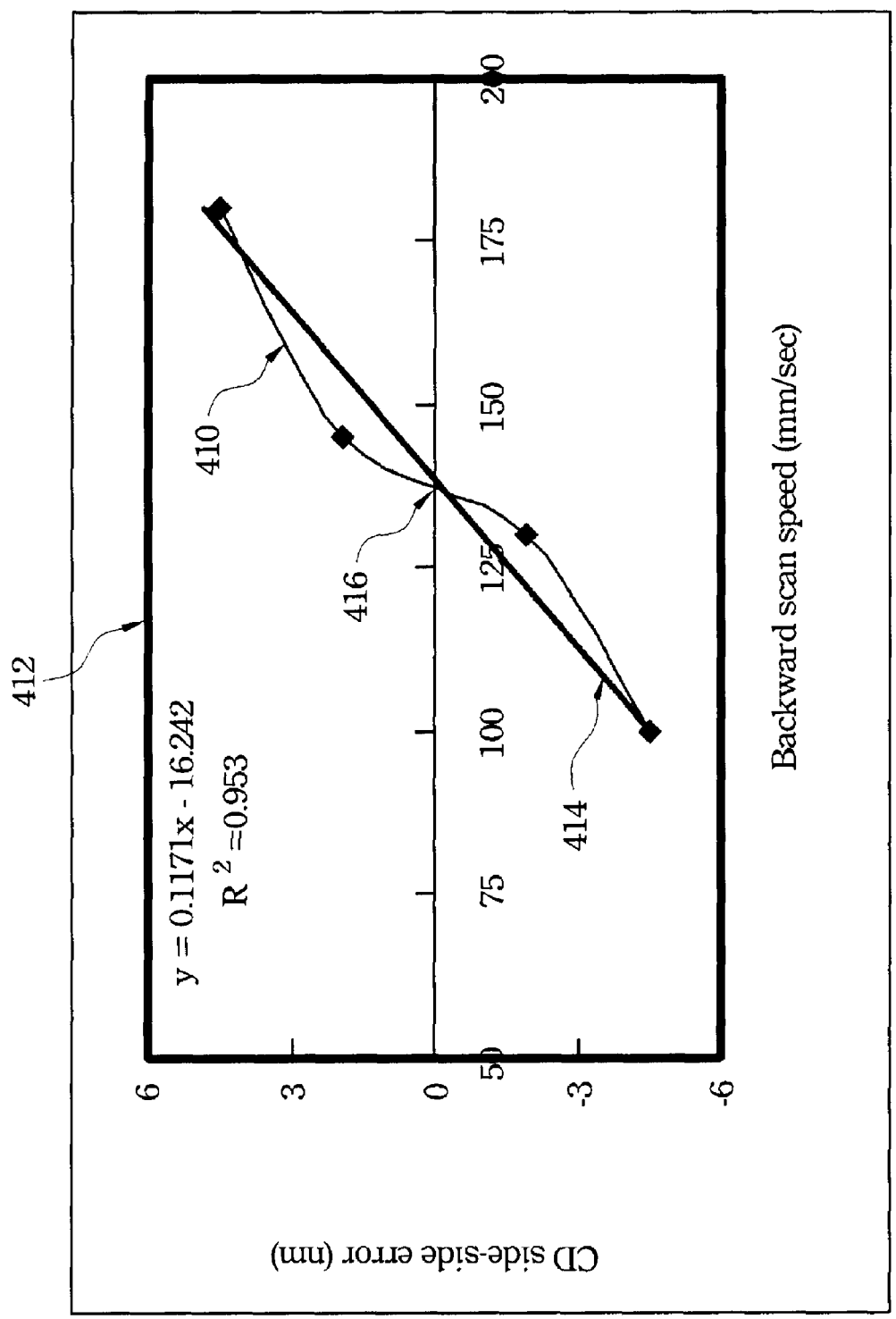
FIG. 5 is a graph of the CD side-to-side model in accordance with an aspect of the present disclosure.

Referring to FIG. 5, graph 402 illustrates the relationship between the CD side-to-side tilting error 408 and backward scan speed 404. Line 410 represents real data that is collected by data processing system 220. A linear function or the second function 412 is derived based on the relationship. The constants b1 and b0 of function 412 are 0.1171 and 16.242, respectively. Line 414 represents the second function 412. From line 414, it is observed that for a CD side-to-side error of about 6 nm, a scan speed compensation of about 175 mm/sec is required. Similarly, for a CD side-to-side error of about 3 nm, a scan speed compensation of about 150 mm/sec is required.

In addition, an optimal scan speed may be identified from line 414 that achieves a near zero CD side-to-side tilting error. In this example, the optimal scan speed is about 137 mm/sec, as illustrated by intersection 416. At the optimal scan speed, the CD tilting error 408 is about 0.8 nm and the critical dimension measured 406 is about 4.7 nm. This CD measured meets the CD uniformity requirement of this mask or wafer, which is about 4.9 nm.

An example of the first function derived in the vacuum effect model for an entire mask or wafer is illustrated in equation (5).

$$y1 = an*x1n + a(n-1)*x1(n-1) + \ldots + a1*x1 + a0 \quad (5)$$

Equation (5) is a function that expresses the CD side-to-side tilting error in terms of exposure times collected for the entire mask or wafer. In this example, y1 represents a total mask CD side-to-side tilting error for the whole mask or wafer. $x1^n$, $x1^{(n-1)}$, ..., x1 represent exposure times of all local areas. The values an, a(n-1), ..., a1, and a0 are constants. Equation (5) is a function that illustrates the blank material photoresist vacuum effect caused by different exposure times. Constants an, a(n−1), . . . , a1, and a0 may be derived based on different CD side-to-side tilting errors and exposure times collected from different masks or wafers. Constants a0 and a1 may vary based on the type of the photoresist or writer used.

An example of the second function derived in the CD side-to-side model for an entire mask or wafer is illustrated in Equation (6).

$$y2=bn*x2n+b(n-1)*x2(n-1)+ \ldots +b1*x2+b0 \quad (6)$$

Equation (6) is a function that expresses the mask CD side-to-side tilting error in terms of scan speeds. In this example, y1 represents the total CD side-to-side tilting error for the entire mask or wafer. $x2^n$, $x2^{(n-1)}$, . . . , x2 represent scan speeds across all local areas. The values bn, b(n−1), . . . , bn, b(n−1), . . . , b1 and b0 are constants. In one embodiment, constants b0 and b1 may be derived based on different CD side-to-side tilting errors and scan speeds collected from different masks or wafers. Constants b0 and b1 may vary based on the type of the photoresist or writer.

An example of equating the first and second functions for data is illustrated in equation (7).

$$y1=y2 \quad (7)$$

In order to achieve a near zero CD side-to-side tilting error, CD side-to-side tilting errors y1 and y2 are set to be equal, as illustrated in equation (8).

$$an*x1n+a(n-1)*x1(n-1)+ \ldots +a1*x1+a0=bn*x2n+b(n-1)*x2(n-1)+ \ldots +b1*x2+b0 \quad (8)$$

Scan speeds, $x2^n$, $x2^{(n-1)}$, . . . , x2, may be adjusted such that the equation (5) and the equation (6) are equal, as illustrated in equation (8). Thus, by modeling the relationship between scan speeds and the CD side-to-side tilting error, the CD side-to-side tilting error caused by long exposure time may be compensated. In addition, better CD uniformity control may be achieved by reducing the CD side-to-side tilting error to near zero. This is essential in the development of high-end masks which have critical dimensions of less than 32 nm.

It is noted that in addition to reducing CD side-to-side tilting error for masks, aspects of the present disclosure may be implemented as a method and system for reducing CD side-to-side tilting error when writing a pattern directly to a wafer. For example, the CD side-to-side model may be implemented in an electron beam (e-beam) system that transfers a high-resolution pattern to a wafer. In this way, the critical dimension uniformity of a wafer may also be improved.

Furthermore, in addition to compensating the vacuum effect, other effects caused by other process parameters may also be compensated with the CD side-to-side model of the present disclosure. In this way, CD uniformity may be improved with respect to other process parameters as well.

In one embodiment, a method for reducing a critical dimension error of a substrate is provided. A first function is identified for correlating a critical dimension error with a first effect. A second function is identified for correlating a critical dimension error with a scan speed. An optimal scan speed for minimizing the critical dimension error is identified by substantially equating the first function with the second function. The substrate may be implemented as a mask or a wafer.

The first function is a function expressing the critical dimension error in terms of an exposure time. The first function is derived from a vacuum effect model. The second function is a function expressing the critical dimension error in terms of a scan speed. The second function may be derived from a critical dimension side-to-side model. The first effect may be a blank photoresist vacuum effect caused by long exposure time.

To minimize the critical dimension error, the scan speed is adjusted dynamically until the first function is substantially equal to the second function and until the critical dimension error is near zero. An example of the first function may be y1=a1*x1+a0, wherein y1 is the critical dimension error, wherein x1 is the exposure time, and wherein a0 and a1 are constants. An example of the second function may be y2=b1*x2+b0, wherein y2 is the critical dimension error, wherein x2 is the scan speed, and wherein b0 and b1 are constants.

Another example of the first function is $$y1=an*x1n+a(n-1)*x1(n-1)+ \ldots +a1*x1+a0,$$

wherein y1 is a total mask side-to-side tilting error for the substrate, wherein $x1^n$, $x1^{(n-1)}$, . . . , x1 are exposure times of local areas on the substrate, and wherein an, a(n−1), . . . , a1, and a0 are constants. Another example of the second function is $$y2=bn*x2n+b(n-1)*x2(n-1)+ \ldots +b1*x2+b0,$$

wherein y1 represents a total CD side-to-side tilting error for the substrate, wherein $x2^n$, $x2^{(n-1)}$, . . . , x2 are scan speeds of local areas on the substrate, and wherein bn, b(n−1), . . . , bn, b(n−1), . . . , b1 and b0 are constants.

In another embodiment, a system for reducing a critical dimension error of a substrate is provided. The system comprises an exposure system for exposing a pattern onto a substrate; a scanning mechanism for developing a substrate after exposure, a puddle arm for moving the scanning mechanism to scan the substrate, and a data processing system for analyzing data collected from the scanning mechanism and the exposure system. The substrate may be implemented as a mask or a wafer. The puddle arm is operable to move the scanning mechanism in at least one of a backward scan direction or a forward scan direction.

The data processing system is operable to collect a scan speed and an exposure time. The data processing system also comprises first identifying means for identifying a first function for correlating a critical dimension error with a first effect, second identifying means for identifying a second function for correlating a critical dimension error with a scan speed, and modifying means for identifying an optical scan speed for minimizing the critical dimension error by substantially equating the first function with the second function.

The first identifying means comprises means for identifying a function expressing the critical dimension error in terms of an exposure time. The second identifying means comprises means for identifying a function expressing the critical dimension error in terms of a scan speed. The first effect may be a blank photoresist vacuum effect caused by long exposure time.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A method of fabricating a pattern onto a substrate, the method comprising:
   exposing the pattern onto the substrate;
   determining a critical dimension (CD) error;
   correlating the CD error with a scan speed of a scanning mechanism, the scanning mechanism being operable to develop the pattern onto the substrate;
   identifying an optimal scan speed for minimizing the CD error based on the correlation between the CD error and the scan speed; and
   after the exposing, the determining, the correlating, and the identifying, developing the substrate using the optimal scan speed.

2. The method of claim 1, wherein determining the CD error is performed using a first function expressing the error in terms of an exposure time of the substrate.

3. The method of claim 2, wherein correlating the CD error with the scan speed is performed using a second function expressing error in terms of a scan speed of the scanning mechanism.

4. The method of claim 3, wherein identifying an optimal scan speed for minimizing the CD error by substantially equating the first function and the second function comprises:
   adjusting the scan speed dynamically until the CD error is near zero.

5. The method of claim 2, wherein the first function is $y1=a1*x1+a0$, wherein $y1$ is the error of a local area on the substrate, wherein $x1$ is the exposure time, and wherein $a0$ and $a1$ are constants.

6. The method of claim 3, wherein the second function is $y2=b1*x2+b0$, wherein $y2$ is the CD error of a local area on the substrate, wherein $x2$ is the scan speed, and wherein $b0$ and $b1$ are constants.

7. The method of claim 1, wherein the substrate is at least one of a mask and a wafer.

8. The method of claim 5, wherein $a0$ and $a1$ are derived based on different CD errors and exposure times collected from different masks or wafers.

9. The method of claim 6, wherein $b0$ and $b0$ are derived based on different CD errors and scan speeds collected from different masks or wafers.

10. The method of claim 2, wherein the first function is $y1=an*x1n+a(n-1)*x1(n-1)+ \ldots +a1*x1+a0$, wherein $y1$ is a total error for the substrate, wherein $x1n, x1(n-1), \ldots, x1$ are exposure times of local areas on the substrate, and wherein $an, a(n-1), \ldots, a1$, and $a0$ are constants.

11. The method of claim 3, wherein the second function is $y2=bn*x2n+b(n-1)*x2(n-1)+ \ldots +b1*x2+b0$, wherein $y1$ represents a total CD error for the substrate, wherein $x2n, x2(n-1), \ldots, x2$ are scan speeds of local areas on the substrate, and wherein $bn, b(n-1), \ldots, bn, b(n-1), \ldots, b1$ and $b0$ are constants.

12. The method of claim 1, wherein the scanning mechanism is used after a post-exposure bake process.

13. A system for fabricating a pattern onto a substrate with reduced critical dimension error, comprising:
   an exposure system for exposing the pattern onto the substrate;
   a scanning mechanism for developing the substrate after exposure;
   a puddle arm for moving the scanning mechanism to scan the substrate; and
   a data processing system for analyzing data collected from the scanning mechanism and the exposure system, wherein the data processing system comprises:
      first identifying means for identifying a first function for correlating a critical dimension error with a first effect;
      second identifying means for identifying a second function for correlating a critical dimension error with a scan speed; and
      third identifying means for identifying an optical scan speed for minimizing the critical dimension error by substantially equating the first function and the second function.

14. The system of claim 13, wherein the first identifying means comprises means for identifying a function expressing the critical dimension error in terms of an exposure time.

15. The system of claim 13, wherein the second identifying means comprises means for identifying a function expressing the critical dimension error in terms of a scan speed.

16. A method for fabricating a pattern onto a substrate, the method comprising:
   exposing the pattern onto the substrate;
   determining a mask critical dimension (CD) side-to-side tilting error, wherein the determining is performed using a first function expressing the critical dimension error in terms of an exposure time of the substrate;
   correlating the mask CD side-to-side tilting error with a scan speed of a scanning mechanism used in developing the substrate, wherein the correlating is performed using a second function expressing the critical dimension error in terms of a scan speed of the scanning mechanism;
   identifying an optimal scan speed for minimizing the mask CD side-to-side tilting error based on the correlation between the determined mask CD side-to-side tilting error and the scan speed, wherein the identifying is performed by substantially equating the first function and the second function; and
   developing the substrate using the optimal scan speed.

17. The method of claim 16, wherein identifying the optimal scan speed further includes adjusting the scan speed dynamically until the first function is substantially equal to the second function.

18. The method of claim 16, wherein the first function is $y1=a1*x1+a0$, wherein $y1$ is the critical dimension error of a local area on the substrate, wherein $x1$ is the exposure time, and wherein $a0$ and $a1$ are constants.

19. The method of claim 16, wherein the second function is $y2=b1*x2+b0$, wherein $y2$ is the critical dimension error of a local area on the substrate, wherein $x2$ is the scan speed, and wherein $b0$ and $b1$ are constants.

* * * * *